(12) United States Patent
Chen et al.

(10) Patent No.: US 7,256,066 B2
(45) Date of Patent: Aug. 14, 2007

(54) FLIP CHIP PACKAGING PROCESS

(75) Inventors: Jian-Cheng Chen, Tainan Hsien (TW);
Yu-Wen Chen, Kaohsiung (TW);
Sheng-Yu Wu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 49 days.

(21) Appl. No.: 10/906,890

(22) Filed: Mar. 11, 2005

(65) Prior Publication Data

US 2005/0202593 A1    Sep. 15, 2005

(30) Foreign Application Priority Data

Mar. 12, 2004    (TW) ............................. 93106613 A

(51) Int. Cl.
*H01L 21/44* (2006.01)
(52) U.S. Cl. ............... 438/106; 257/787; 257/620; 257/778; 438/108; 438/110; 438/112; 438/113

(58) Field of Classification Search ................ 438/106, 438/108, 110, 112, 113; 257/787, 778, 620
See application file for complete search history.

(56) References Cited

U.S. PATENT DOCUMENTS

| 6,991,965 | B2 * | 1/2006 | Ono ........................... 438/114 |
| 2003/0127748 | A1 * | 7/2003 | Fang .......................... 257/778 |
| 2003/0183950 | A1 * | 10/2003 | Bolken ....................... 257/786 |

* cited by examiner

*Primary Examiner*—Thao P. Le
(74) *Attorney, Agent, or Firm*—Jianq Chyun IP Office

(57) ABSTRACT

A flip chip packaging process uses an underfill as an encapsultant to reduce the possibility of delamination from occurring due to differential coefficients of thermal expansion, and thus the reliability of a flip chip package structure can be increased. Furthermore, the flooding of the encapsulant over the cutting line need not be taken into consideration for cutting the substrate. Therefore, the usage area of the substrate usage is increased, i.e., more chips can be mounted per unit area of the substrate.

4 Claims, 4 Drawing Sheets

FLIP CHIP PACKAGING PROCESS

CROSS-REFERENCE TO RELATED APPLICATION

This application claims the priority benefit of Taiwan application serial no. 93106613, filed on Mar. 12, 2004.

BACKGROUND OF THE INVENTION

1. Field of the Invention

This invention relates to a flip chip packaging process, and more particularly to a packaging process using an underfill as an encapsulant.

2. Brief Description of Related Art

In semiconductor industry, integrated circuit (IC) production includes three stages: wafer production, IC production and IC packaging. Dies are obtained by means of wafer production, circuit design, multiple mask processes and wafer sawing. Each die electrically connects to a carrier via its bonding pads. The carrier can be a packaging substrate or a printed circuit board (PCB). Wires and/or bumps are usually used as intermediate connections between the chip and the carrier. A flip chip interconnection technology may be adapted for fabricating a plurality of bumps in area array on the bonding pads of the chip, and then the chip is flipped over for mounting the chip on the carrier, and the bumps of the chip correspond to the contacts of the carrier. Signals are transmitted via the internal circuit of the carrier and the contacts to an external device such as a motherboard.

As the integration of the chip increases, package structure of the chip becomes diverse. The flip chip package has been applied in the chip packaging field such as chip scale package (CSP), flip chip/ball grid array (FC/BGA) type package due to its advantages of small chip disposing area and short signal transmission path.

FIG. 1A-1C are schematic views of a conventional flip chip packaging process. Referring to FIG. 1A, a substrate 100 is provided. A plurality of chips 110 are mounted on a substrate 100 by flip chip interconnection technology to form a plurality of CSP package units 102. The substrate 100 can be, for example, a multi-layer circuit substrate. An outermost circuit layer of the substrate has a plurality of contacts (not shown). The contacts can be arranged in array or in circle on a chip bonding area (slanted area) of the substrate 100 as an intermediate of electric connection between the substrate 100 and the chip 110.

Referring to FIG. 1B, a plurality of bumps 114 are formed on an active surface of the chip 110 corresponding to the contacts of the substrate for electrical connection between the chip and the substrate. It is noted that in order to reduce damage due to the thermal stress caused by the differential coefficients of thermal expansion between the chip 110 and the substrate 100, an underfill 130 is filled between the chip 110 and the substrate 100 to protect the bumps 114 from being cracked/damaged due to the thermal stress between the chip 110 and the substrate 100.

After the underfill is filled, the chip 110 is exposed from the substrate and thus becomes vulnerable to damage by external forces or get deteriorated by atmospheric dusts or moisture. Therefore, an encapsulant 132 is used to cover the exposed surface of the substrate 100 and the top of the chip 110 in order to protect the chip 110. It is noted that the encapsulant 132 is different from the underfill 130. The encapsulant 132 is subsequently baked at a high temperature to permanently cure. The underfill 130 is formed in a solid state at normal temperature, while it is formed in a semi-solid state when be heated. Therefore, there is a significant difference between the inherent properties of these two materials.

Referring to FIG. 1B, after the chip molding is completed, the substrate 100 and the encapsulant 132 are cut by a sawing machine to form a plurality of flip chip package structures 104, as shown in FIG. 1C. It is noted that in addition to the space between the chips 110 for the sawing tool 10 to cut the substrate 100, a distance D is required for an underfill dispenser to move along edges of the chip as indicated by arrows in FIG. 1A. The distance D is used to prevent the underfill 130 from flooding over a cutting line 112. However, the distance D is limited by the size of the chip in CSP packaging, that is, the area outside the chip bonding area must be less than 20% of total area of all package structures. The limit of the distance D leads to flooding of the underfill 130 over the cutting line 112, which makes dispensing of the underfill difficult and further exposes the interface of the underfill 130 and the encapsulant 132 through the flip chip package structure 104 after the molding and cutting process. Furthermore, since the underfill 130 and the encapsulant 132 are different materials, delamination tends to occur due to the differential coefficients of thermal expansion, and thus the performance of the chip 110 will be deteriorated due to external moisture or temperature change.

SUMMARY OF THE INVENTION

Accordingly, the present invention is directed to a chip molding process, in which an underfill is used as an encapsulant to reduce the occurrence of delamination after molding process.

The present invention is also directed to a flip chip molding process, in which the space between chips for cutting a substrate is small so that the usage area on the substrate is increased.

According to an embodiment of the present invention, a substrate having a stopper ring on a peripheral region thereof is provided. A chip is mounted on the substrate using a flip chip interconnection technology. The chip has an active surface and a back opposite to the active surface, and the active surface of the chip is electrically connected to the substrate. An underfill is dispensed in the area delimited by the stopper ring. The underfill further encloses the back of the chip.

According to another embodiment of the invention, a flip chip packaging process is provided. A plurality of chips is mounted on a substrate using a flip chip interconnection technology to form a plurality of chip-size package units. Each chip has an active surface and a back opposite to the active surface, and a plurality of bumps are formed on the active surface for electrically connecting the chips and the substrate. An underfill fills between the chips and the substrate to enclose the bumps and the backs of the chips. The substrate and the underfill are cut to form a plurality of flip chip package structures.

In an embodiment of the invention, before the step of filling the underfill, a stopper ring is further formed on a peripheral region of the substrate to delimit the underfill. The step of filling the underfill further comprises dispensing the underfill along the spaces between the chips, and then enclosing the backs of the chips. Before the substrate is cut, the substrate is baked to cure the underfill.

Still, in another aspect, the invention further provides a flip chip package structure including a substrate, a chip and an underfill. The substrate can be a ceramic substrate. The chip is mounted on the substrate. The chip has an active surface and a back opposite to the active surface, and a plurality of bumps are formed on the active surface for electrically connecting the chip to the substrate. The underfill fills between the substrate and the chip, and further encloses the back of the chip.

The flip chip packaging of the invention uses the underfill as the encapsultant, therefore the occurrence of delamination due to differential coefficients of thermal expansion between different materials can be reduced and thus the reliability of the flip chip package structure is increased. Furthermore, the flooding of the encapsulant over the cutting line is not an issue. Therefore, the available area on the substrate is increased, i.e., more chips can be mounted on the substrate.

DETAILED DESCRIPTION OF EMBODIMENTS

Figure 1A:
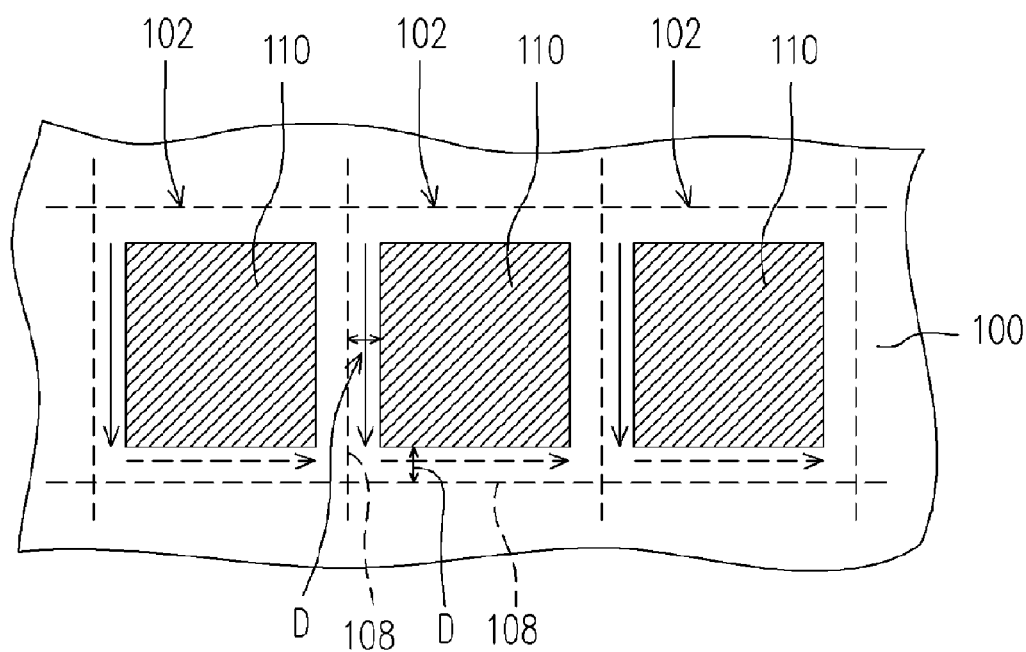
FIG. 1A-1C are schematic views of a conventional flip chip packaging process.
Figure 1B:
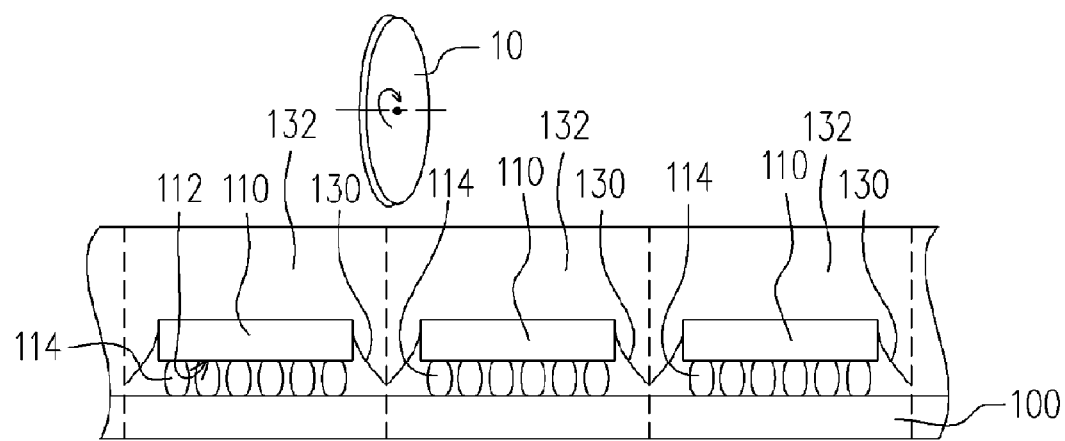
Figure 1C:
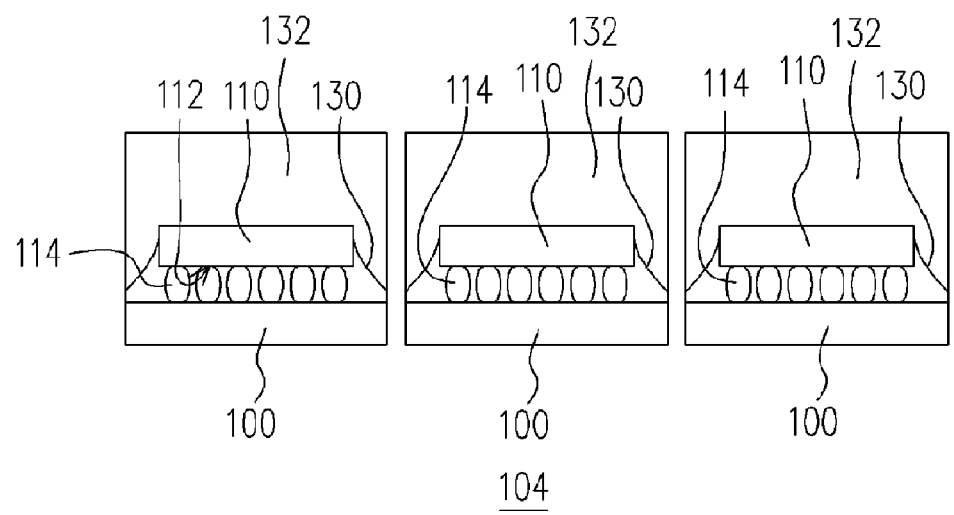
Figure 2A:
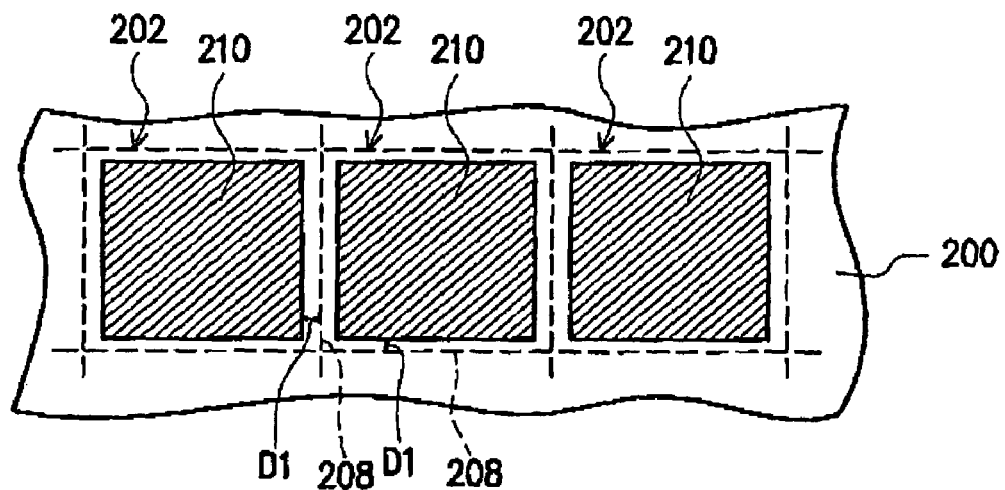
FIG. 2A-2E are schematic views of a flip chip packaging process according to one embodiment of the invention.

FIG. 2A-2E are schematic views of a flip chip packaging process according to one embodiment of the invention. Referring to FIG. 2A, a substrate 200 is provided. The substrate 200 has a plurality of substrate units 202 on which a plurality of chips are mounted using a flip chip interconnection technology to form a plurality of chip scale package (CSP) units. The substrate 200 can be, for example, a multiple-layer circuit substrate of which the outermost layer has a plurality of contacts (not shown). Those contacts can be arranged on chip bonding areas (indicated by a slanted area) of the substrate 200 in various manners as intermediates of electrical connection of the substrate 200 to the chips 210.

It is noted that there is a predetermined space between the chips 210 for cutting the substrate 200. The distance D1 between edges of the chips 210 and cutting line 208 is as small as possible, and the whole width of a cutting tool can be accommodated into the distance D1. The total area of the chip bonding areas after cutting is more than 90%, preferably more than 95% of the total area of the original substrate. The usage area of the substrate 200 is significantly increased, and the amount of chips 210 per unit area of the substrate 200 is increased.

Figure 2B:
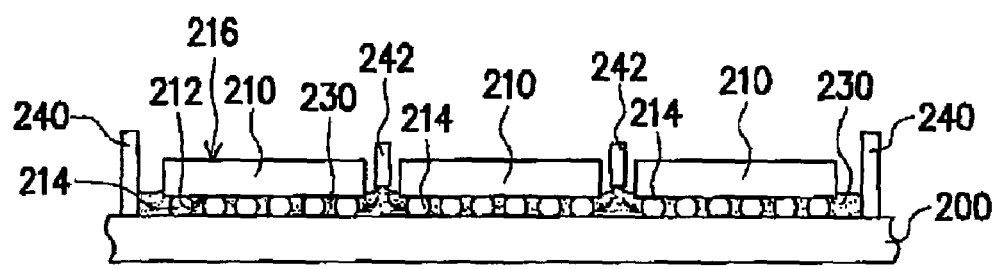

Referring to FIG. 2B, each chip 210 has an active surface 212 and a back surface 216 opposite to the active surface 212. A plurality of bumps 214 are formed on the active surface 212 corresponding to the contacts on the chip bonding areas of the substrate 200, so that the chips 210 are electrically connected to the substrate 200. It is noted that in order to reduce damage to the chips 210 and the substrate 200 due to differential coefficient of thermal expansion between the chip 210 and the substrate 200, an underfill 230 is filled between the chips 210 and the substrate 200. However, in die prior art, in order to avoid the underfill 130 to flood over the cutting line 108, the dispensing machine has to be close to the edges of the chips 110 for carefully dispensing small portions of the underfill along the edges of the chips 110. Therefore, the dispensing process takes a long time, which can be accomplished with great difficulty. In the present invention, the underfill 230 is dispensed over the surface of the substrate 200 without any consideration of underfill flooding over the cutting line 208. Instead, the underfill 230 is dispensed over the whole surface of the substrate 200 to speed up the underfill dispensing. Furthermore, the underfill 230 not only fills between the chips 210 and the substrate 200, but also encloses the back surfaces 216 of the chips 210 and neighboring areas thereof as an encapsulant. Thereby, the underfill dispensing time can be significantly reduced and the underfill dispensing and chip molding process are completed at the same step.

Figure 2C:
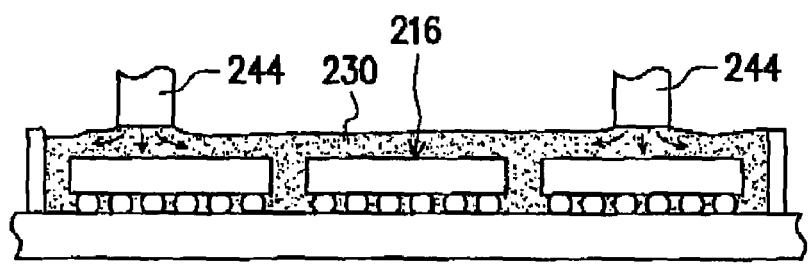

Referring to FIG. 2B, before the underfill 230 is filled on the substrate 230, a stopper ring 240 can be formed on a peripheral region of the substrate 200. When the underfill 230 is dispensed over the surface of the substrate 200, the stopper ring 240 delimits the underfill 230. In dispensing the underfill, a dispenser head 242 with small diameter moves along gaps between the chips 210 to fill the underfill 230 under the chips 210. Referring to FIG. 2C, a dispenser head 244 with large diameter adds the flows of the underfill 230 to enclose all the chips 210 on the substrate 200. In this embodiment, the height of the underfill 230 is not limited as long as the surfaces 216 of the chips 210 and the neighboring regions thereof are enclosed. The underfill enclosing the surfaces 216 of the chips 210 and the neighboring regions thereof is used as the encapsulant which has the same effect as the conventional molding compound 132 to protect the chips 210 from being damaged by external forces or moisture.

It is noted that the underfill and the encapsulant are the same material, which does not suffer delamination as the differential coefficient of thermal expansion between the underfill and encapsulant is negligible. The reliability of the flip chip package structure according to the invention can be effectively increased.

Figure 2D:
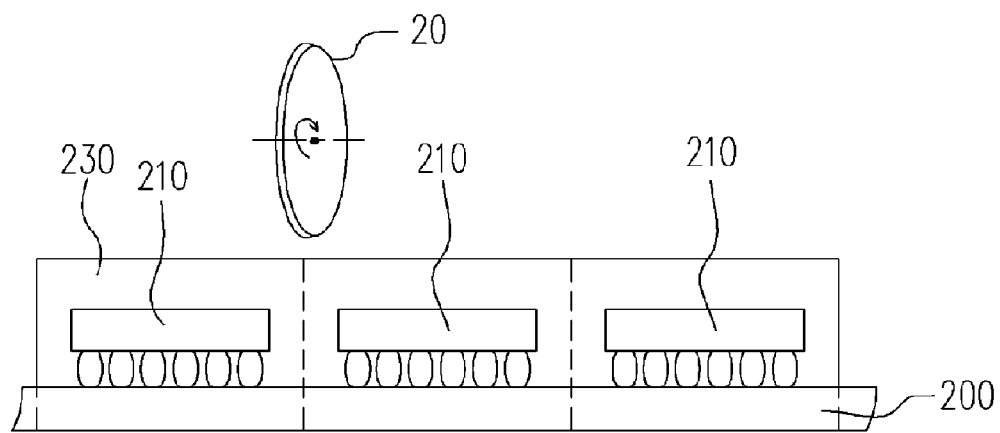
Figure 2E:
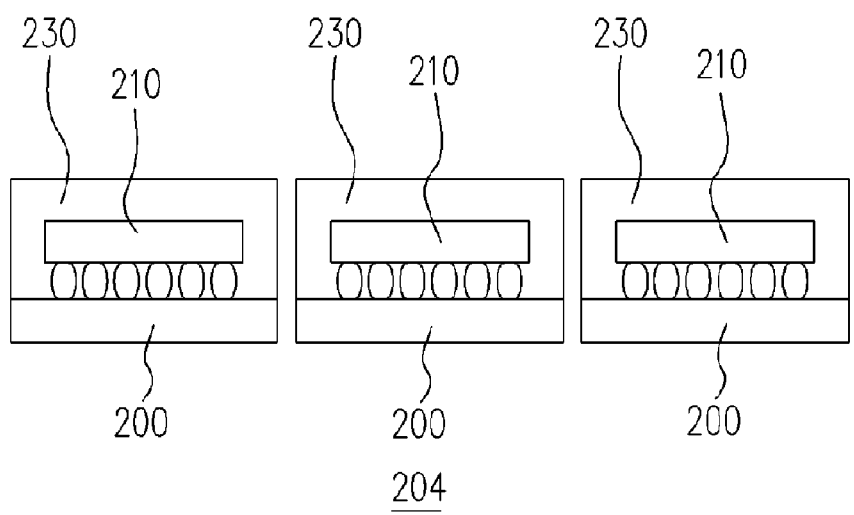

Referring to FIG. 2D, after the encapsulant is applied, the underfill is baked to cure. Then a sawing machine 20 is used to cut the substrate 200 and the underfill 230 to form a plurality of flip-chip package units 204 as shown in FIG. 2E.

In other applications, a plurality of chips are mounted on a substrate, such as a ceramic substrate, by flip chip interconnection technology. Each chip electrically connects to the substrate. Next, an underfill is dispensed over the substrate. The underfill further encloses backs of the chips and around the bumps. Finally, the substrate and the underfill are cut to form a plurality of flip chip package units. The ceramic substrate cannot be encapsulated with the use of a cavity. In the present invention, the underfill is used as the encapsulant and therefore both the underfill filling and chip molding can be completed at the same step and the reliability of the flip chip package structure can be effectively increased. Furthermore, after the underfill encapsulates the chips, the chips can be protected from being damaged by external forces and any deterioration of performance of chips due to the moisture and dust can be prevented as well.

The flip chip packaging process of the invention uses an underfill as the encapsuant, thereby reducing the occurrence of delamination due to differential coefficients of thermal expansion between the underfill and the encapsuant and thus the reliability of the flip chip package structure can be effectively increased. Furthermore, the flooding of the encapsulant over the cutting line need not be taken into consideration for cutting the substrate. Therefore, the usage area on the substrate is increased, i.e., more chips can be mounted per unit area of the substrate.

In view of the forgoing, the flip chip packaging process according to the invention has the following advantages.

(1) The underfill is dispensed over the surface of the substrate without any considering the risk of flooding of the underfill over the cutting line. Instead, the underfill is dispensed over the whole surface of the substrate to speed up the underfill dispensing process.

(2) The distance between the edges of chips and the cutting line can be as small as possible, so that more chips can be mounted on the substrate due to availability of increased usage area of the substrate.

(3) The underfill is not only filled between the chips and the substrate, but also encloses the backs of the chips and the peripheral regions of the chips as the encapsulant. Therefore, the underfill filling and the chip molding can be completed at the same step.

(4) The underfill is used as the encapsulant, therefore the occurrence of delamination due to differential coefficients of thermal expansion between the underfill and the encapsuant reduced as the materials of underfill and encapsulant are the same and thus the reliability of the flip chip package structure is increased.

(5) When the substrate is a ceramic substrate, the underfill filling and the chip molding using the same underfill material can be completed at the same step and thereby increase the reliability of the flip chip package structure.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A chip packaging process, comprising:
   providing a substrate, wherein the substrate has a stopper ring disposed around a peripheral region of the substrate;
   chip has an active surface and a back opposite to the active surface, and the active surface of the chip electrically connects to the substrate;
   dispensing an underfill in the area delimited by the stopper ring, wherein the underfill further encloses the back of the chip; and
   cutting the underfill and the substrate to form a chip package structure, wherein the stopper ring is also separated from die chip package structure.

2. The process of claim 1, further comprising a step of baking the substrate to cure the underfill.

3. The process of claim 1, wherein during the step of dispensing the underfill, the underfill flows along a space between tire chip and fills into a gap between the chip and the substrate, and ten encloses the back of the chip.

4. The process of claim 1, further comprising a step of baking the substrate to cure the underfill before the step of cutting the underfill and the substrate.

* * * * *